(12) United States Patent
Bailey et al.

(10) Patent No.: US 10,367,443 B2
(45) Date of Patent: Jul. 30, 2019

(54) SYSTEMS AND METHODS FOR SUPPORTING SOLAR PANELS

(71) Applicant: Alion Energy, Inc., Richmond, CA (US)

(72) Inventors: Sean Bailey, Emeryville, CA (US); Rodney Hans Holland, Novato, CA (US); Miguel M. L. Praca, Kentfield, CA (US)

(73) Assignee: Alion Energy, Inc., Richmond, CA (US)

( * ) Notice: Subject to any disclaimer, the term of this patent is extended or adjusted under 35 U.S.C. 154(b) by 0 days.

(21) Appl. No.: 15/643,296

(22) Filed: Jul. 6, 2017

(65) Prior Publication Data
US 2018/0091087 A1 Mar. 29, 2018

Related U.S. Application Data

(60) Provisional application No. 62/359,959, filed on Jul. 8, 2016.

(51) Int. Cl.
*H02S 20/20* (2014.01)
*H01L 31/042* (2014.01)
(Continued)

(52) U.S. Cl.
CPC .............. *H02S 20/20* (2014.12); *F24S 25/12* (2018.05); *F24S 25/16* (2018.05); *F24S 25/617* (2018.05);
(Continued)

(58) Field of Classification Search
CPC .......... H02S 20/10; H02S 20/00; H02S 20/20; H02S 20/30; H02S 30/10; F24S 25/16;
(Continued)

(56) References Cited

U.S. PATENT DOCUMENTS

| 5,125,608 A | * | 6/1992 | McMaster | ............... F24J 2/5232 126/570 |
| 5,228,924 A | * | 7/1993 | Barker | ..................... F24J 2/541 136/246 |

(Continued)

FOREIGN PATENT DOCUMENTS

DE    20 2005 003 750 U1    5/2005

OTHER PUBLICATIONS

Patent Cooperation Treaty, International Search Report for PCT/US2017/040872, dated Sep. 8, 2017 (3 pages).

(Continued)

*Primary Examiner* — Patrick D Hawn
(74) *Attorney, Agent, or Firm* — Jones Day

(57) ABSTRACT

Systems and methods are provided for supporting (racking) solar (e.g., photovoltaic) panels. At least one concrete track can be formed, first, second, and third racking structures can be assembled, each including two legs, landings at tops the legs, and feet that respectively can be secured to the at least one concrete track. A first solar panel can be placed on the landings of the first and second racking structures. A first edge of the first solar panel can be secured to each the landings of the first racking structure. A second solar panel can be placed on the landings of the second racking structure and on the landings of the third racking structure. A second edge of the first solar panel and a first edge of the second solar panel can be secured to each the landings of the second racking structure.

23 Claims, 11 Drawing Sheets

(51) Int. Cl.
*H02S 20/00* (2014.01)
*H02S 20/30* (2014.01)
*H02S 20/10* (2014.01)
*H02S 30/10* (2014.01)
*F24S 25/16* (2018.01)
*F24S 25/67* (2018.01)
*F24S 25/617* (2018.01)
*F24S 25/12* (2018.01)

(52) U.S. Cl.
CPC ............ *F24S 25/67* (2018.05); *H01L 31/042* (2013.01); *H02S 20/00* (2013.01); *H02S 20/10* (2014.12); *H02S 20/30* (2014.12); *H02S 30/10* (2014.12); *Y02E 10/50* (2013.01)

(58) Field of Classification Search
CPC .......... F24S 25/67; F24S 25/617; F24S 25/12; F24S 25/13; H01L 31/042
See application file for complete search history.

(56) References Cited

U.S. PATENT DOCUMENTS

| | | | | |
|---|---|---|---|---|
| 8,413,391 | B2* | 4/2013 | Seery | F16B 2/12 52/173.3 |
| 8,522,491 | B2* | 9/2013 | Kneip | F24S 25/50 52/173.3 |
| 8,684,190 | B2* | 4/2014 | Abar | H02S 20/30 211/41.1 |
| 8,939,143 | B2* | 1/2015 | Zuritis | H02S 20/10 126/569 |
| 9,163,861 | B2* | 10/2015 | Al-Haddad | H02S 20/30 |
| 9,379,660 | B2* | 6/2016 | Al-Haddad | H02S 20/30 |
| 9,462,734 | B2* | 10/2016 | Swahn | H02S 20/00 |
| 9,641,123 | B2* | 5/2017 | Swahn | H02S 20/30 |
| 9,655,292 | B2* | 5/2017 | Swahn | H02S 20/00 |
| 9,657,967 | B2* | 5/2017 | Adriani | H01L 31/18 |
| 2010/0089389 | A1* | 4/2010 | Seery | F24S 25/65 126/608 |
| 2010/0212715 | A1* | 8/2010 | Almy | H01L 31/0422 136/245 |
| 2011/0088688 | A1 | 4/2011 | Sha et al. | |
| 2011/0284057 | A1* | 11/2011 | Swahn | H02S 40/10 136/251 |
| 2012/0090665 | A1* | 4/2012 | Zuritis | H02S 20/00 136/251 |
| 2012/0103391 | A1* | 5/2012 | Tucker | F24S 25/65 136/245 |
| 2012/0125408 | A1* | 5/2012 | Reyes | H02S 20/23 136/251 |
| 2012/0125869 | A1* | 5/2012 | Abar | H02S 20/30 211/26 |
| 2012/0267328 | A1* | 10/2012 | McPheeters | H02S 20/00 211/41.1 |
| 2013/0068275 | A1* | 3/2013 | Swahn | H02S 20/00 136/244 |
| 2013/0133275 | A1 | 5/2013 | Bindschedler et al. | |
| 2013/0174889 | A1* | 7/2013 | Dalland | E04H 6/025 136/245 |
| 2013/0228537 | A1* | 9/2013 | Powrozek | H01L 31/0521 211/26 |
| 2013/0276304 | A1* | 10/2013 | Flaherty | H01L 31/0521 29/890.033 |
| 2014/0158649 | A1* | 6/2014 | Al-Haddad | H02S 20/30 211/41.1 |
| 2016/0204731 | A1* | 7/2016 | Al-Haddad | H02S 20/00 211/182 |
| 2016/0365823 | A1* | 12/2016 | French | H02S 20/30 |
| 2016/0365830 | A1* | 12/2016 | Bailey | H02S 20/32 |
| 2017/0331414 | A1* | 11/2017 | Bailey | H02S 20/10 |
| 2018/0091087 | A1* | 3/2018 | Bailey | H02S 20/20 |

OTHER PUBLICATIONS

Patent Cooperation Treaty, Written Opinion of the International Searching Authority for PCT/US2017/040872, dated Sep. 8, 2017 (6 pages).

* cited by examiner

Outer hole on strut is used for attachments in inter-module location.

Inner hole on strut is used for attaching the strut to both legs of a module. Tear-drop shape secures strut even without nut in place.

Lug at end of row attaches to a conductor that will provide a path between the entire row of modules and ground.

Spacer struts provide grounding path between all modules in the row.

SYSTEMS AND METHODS FOR SUPPORTING SOLAR PANELS

CROSS-REFERENCE TO RELATED APPLICATIONS

This application claims the benefit of the following application, the entire contents of which are incorporated by reference herein:

U.S. Provisional Application No. 62/359,959, filed Jul. 8, 2016 and entitled "Systems and Methods for Assembly, Operation, and Maintenance of Photovoltaic Modules."

FIELD

This application relates to supporting solar panels, such as photovoltaic panels.

BACKGROUND

A key component of a solar photovoltaic (PV) power plant is a mechanical support structure, which can be referred to as racking, that holds the PV modules of the power plant. Large numbers of mechanical support structures can be used for large solar plants.

SUMMARY

Systems and methods are provided for supporting (which also can be referred to as racking) solar panels, such as photovoltaic panels. The present racking systems can resist gravity to support the modules and can secure the modules in the face of wind and seismic loads. The racking system's foundation can be compatible with the ground or soil at the site. The racking system also can be relatively inexpensive, and installation can be relatively fast and easy, e.g., when used for large solar plants. Exemplary configurations of solar power plant racking systems and methods for constructing and using the racking system are provided herein. Certain configurations include the use of slip-formed concrete tracks as ballast for the racking system and using a lightweight metal racking system that supports PV modules and is adhered to the concrete tracks.

Under one aspect, a method of supporting solar panels is provided that includes forming at least one concrete track; and assembling first, second, and third racking structures each including two legs, landings at tops of respective ones of the legs, and feet at bottoms of respective ones of the legs. The feet of the assembled first racking structure can be secured to the at least one concrete track; the feet of the assembled second racking structure can be secured to the at least one concrete track; and the feet of the assembled third racking structure can be secured to the at least one concrete track. A first solar panel can be placed on the landings of the first and second racking structures. A first edge of the first solar panel can be secured to each the landings of the first racking structure. A second solar panel can be placed on the landings of the second racking structure and on the landings of the third racking structure. A second edge of the first solar panel and a first edge of the second solar panel can be secured to each the landings of the second racking structure.

Optionally, forming the at least one concrete track includes slip forming first and second discrete concrete tracks.

Additionally, or alternatively, each of the first, second, and third racking structures optionally further includes a cross brace coupling the legs of that racking structure to one another, the cross brace extending in a direction substantially transverse to the at least one concrete track.

Additionally, or alternatively, each of the first, second, and third racking structures optionally further includes a strut extending in a direction substantially parallel to the at least one concrete track, the strut of the first racking structure coupling one of the legs of the first racking structure to one of the legs of the second racking structure, the strut of the second racking structure coupling one of the legs of the second racking structure to one of the legs of the third racking structure.

Additionally, or alternatively, securing the feet to the concrete track optionally includes inserting the feet into grooves of the concrete track and applying adhesive within the grooves.

Additionally, or alternatively, securing the feet to the concrete track optionally includes setting the feet into the concrete track while the concrete is wet.

Additionally, or alternatively, securing the second edge of the first solar panel and the first edge of the second solar panel to each the landings of the second racking structure optionally includes fastening a structure to that landing, wherein the structure presses the solar panel onto that landing. As a further option, the first and second solar panels optionally each can include a frame, and each of the landings can include a hook flange under which the frame of one of the first and second solar panels fits to pull the solar panel onto that landing. As an additional or other option, the structure optionally includes a retainer including first and second overhangs that respectively contact the upper surfaces of the first and second solar panels. As another option, the first and second solar panels each can be frameless, each landing can include a gasket, and the structure can include a clamp that contacts the upper surfaces of the first and second solar panels.

Additionally, or alternatively, the first solar panel optionally can be secured to the landings of the first and second racking structures after the first and second racking structures are secured to the at least one concrete track.

Additionally, or alternatively, the first solar panel optionally can be secured to the landings of the first and second racking structures before the first and second racking structures are placed on and secured to the at least one concrete track. As a further option, the third racking structure can be placed on and secured to the at least one concrete track after the first solar panel is secured to the landings of the first and second racking structures.

Under another aspect, a system is provided for supporting a solar panel. The system can include at least one concrete track; and first, second, and third racking structures each including two legs, landings at tops of respective ones of the legs, and feet at bottoms of respective ones of the legs. The feet of the first, second, and third racking structures can be secured to the at least one concrete track. A first solar panel can be disposed on the landings of the first and second racking structures. A first edge of the first solar panel can be secured to each the landings of the first racking structure. A second edge of the first solar panel and a first edge of a second solar panel are secured to each the landings of the second racking structure.

Optionally, the at least one concrete track includes slip-formed first and second discrete concrete tracks.

Additionally, or alternatively, each of the first, second, and third racking structures optionally further can include a cross brace coupling the legs of that racking structure to one another, the cross brace extending in a direction substantially transverse to the at least one concrete track.

Additionally, or alternatively, each of the first, second, and third racking structures optionally further can include a strut extending in a direction substantially parallel to the at least one concrete track, the strut of the first racking structure coupling one of the legs of the first racking structure to one of the legs of the second racking structure, the strut of the second racking structure coupling one of the legs of the second racking structure to one of the legs of the third racking structure.

Additionally, or alternatively, the feet optionally can be disposed in grooves of the concrete track and locked within the grooves with adhesive. As another option, the feet can be set into the concrete track.

Additionally, or alternatively, the second edge of the first solar panel and the first edge of the second solar panel optionally can be secured to each of the landings of the second racking structure by a structure fastened to that landing, wherein the structure presses the solar panel onto that landing. As a further option, the first and second solar panels each can include a frame and each of the landings can include a hook flange under which the frame of one of the first and second solar panels fits to pull the solar panel onto that landing. As a still further option, the structure can include a retainer including first and second overhangs that respectively contact the upper surfaces of the first and second solar panels. As another option, the first and second solar panels each can be frameless, each landing can include a gasket, and the structure can include a clamp that contacts the upper surfaces of the first and second solar panels.

DETAILED DESCRIPTION

Systems and methods are provided for racking solar panels, such as photovoltaic panels.

Figure 1:
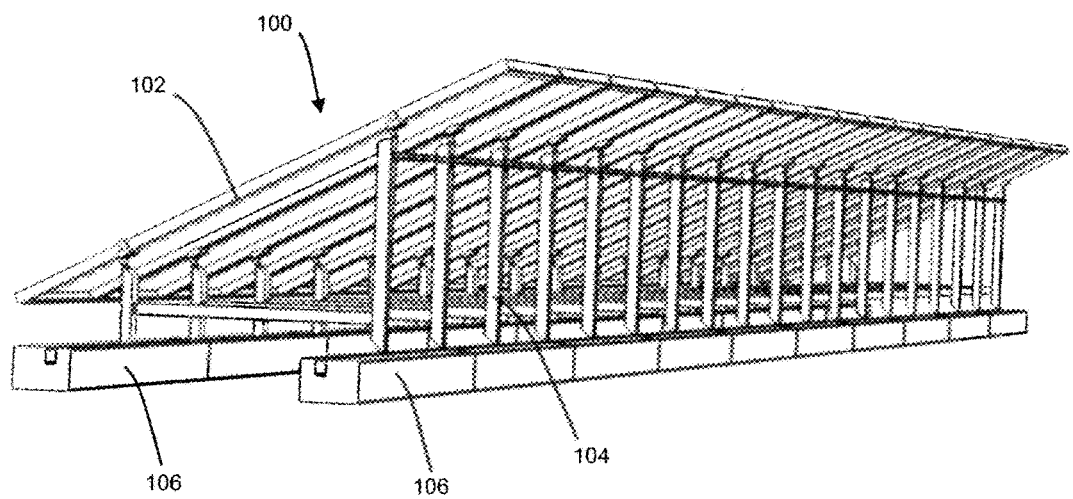
FIG. 1 schematically illustrates a perspective view of one row of an exemplary configuration of a solar collector system.

FIG. 1 schematically illustrates a perspective view of one row of an exemplary configuration of a solar collector system 100 including a fixed-tilt racking system. A solar power plant can include a single row or any other suitable number of rows, and typically can include a plurality of rows. The solar collector row includes framed solar photovoltaic (PV) panels 102 disposed upon a racking system 104, which can be made of or can include metal, plastic, another synthetic material, or any suitable combination of these or other materials. The solar collector system 100 can include a concrete support 106 disposed on the ground of the installation site, such as an elongated slip-formed ballast that in one exemplary configuration includes an integrated concrete track and in another exemplary configuration includes two discrete concrete tracks that run parallel to one another along the length of the row. Further details of the configuration illustrated in FIG. 1, as well as of alternative options, are described below. The racking system 104 can be fastened to the concrete support 106, e.g., can be fastened to two concrete tracks in the illustrated, nonlimiting configuration. Optionally, the racking system 104 can be attached to the concrete support 106 with an adhesive. As another option, the racking system 104 can be attached to the concrete support 106 by placing feet of the racking system 104 into the concrete while the concrete is still wet and letting the concrete harden around the feet of the racking system, e.g., by wet-setting the feet into the concrete.

Figure 2:
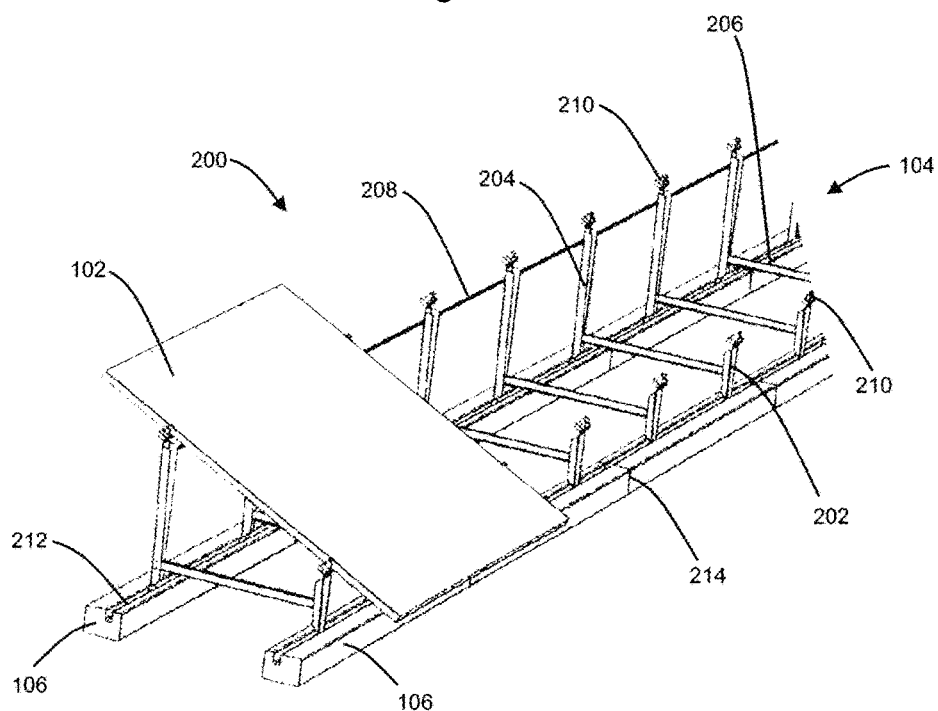
FIG. 2 schematically illustrates a perspective view of an exemplary configuration of a solar collector system row that utilizes solar modules that include frames.

FIG. 2 schematically illustrates a perspective view of an exemplary configuration of a solar collector system row 200 that utilizes solar modules that include frames. The view is shown as partially assembled for clarity, and it should be understood that row 200 could be completed in similar fashion as illustrated in FIG. 2. In this exemplary configuration, the racking system 104 is disposed upon two concrete tracks 106, and one framed solar (e.g., PV) module 102 is shown attached to the racking. The racking system 104, which suitably can be used with system 100 illustrated in FIG. 1, includes front legs 202, rear legs 204, cross braces 206, struts 208, and landings 210. Each leg 202, 204 includes a foot as well as a bottom of the leg adjacent to the foot (foot and bottom of leg not shown in FIG. 2). The front legs 202 support the front of the PV module, and the rear legs 204 support the rear end of the modules 102 and are taller than front legs 202 such that the modules are supported at an angle relative to the ground between about 10 degrees and about 70 degrees. The front legs 202 can be substantially vertical and parallel to one another, and the rear legs 204 can be substantially parallel to one another and to the front legs. Alternatively, the front and rear legs can be angled such that the distance between front and rear is longer between the lower part of the legs than the upper part of the legs. The front legs 202 can be substantially evenly spaced apart from one another along the length of concrete track 105, and rear legs 204 can be substantially evenly spaced apart from one another along the length of concrete track 106 at the same spacing as front legs 202.

In the exemplary configuration illustrated in FIG. 2, the cross braces 206 are coupled to the front legs 202 and the rear legs 204 and are configured so as to provide strength and stiffness in the transverse direction from the primary direction of the row. The struts 208 each are coupled to adjacent rear legs 204 and are configured so as to provide strength and stiffness along the direction of the row. The landings 210, which are located at the tops of each front leg 202 and each rear leg 204, are configured so as to secure the solar module 102 onto the racking system 104. Each concrete track 106 can be configured so as to include a groove 212. The foot on each front leg 202 and rear leg 204 fit into a respective groove 212, and adhesive can be used to secure the foot to the walls of the groove. For example, the feet on front legs 202 all can fit within the same groove as one another, e.g., the groove of the forward one of the concrete tracks 106, and the feet on rear legs 204 all can fit within the same groove as one another, e.g., the groove of the rear one of the concrete tracks. The concrete tracks 106 optionally include control joints 214 that are configured so as to inhibit crack formation and to draw cracks away from the adhesion points of the racking. In some configurations, a control joint is or includes a cut in the concrete track 106 that can be made before the concrete solidifies.

Figure 3:
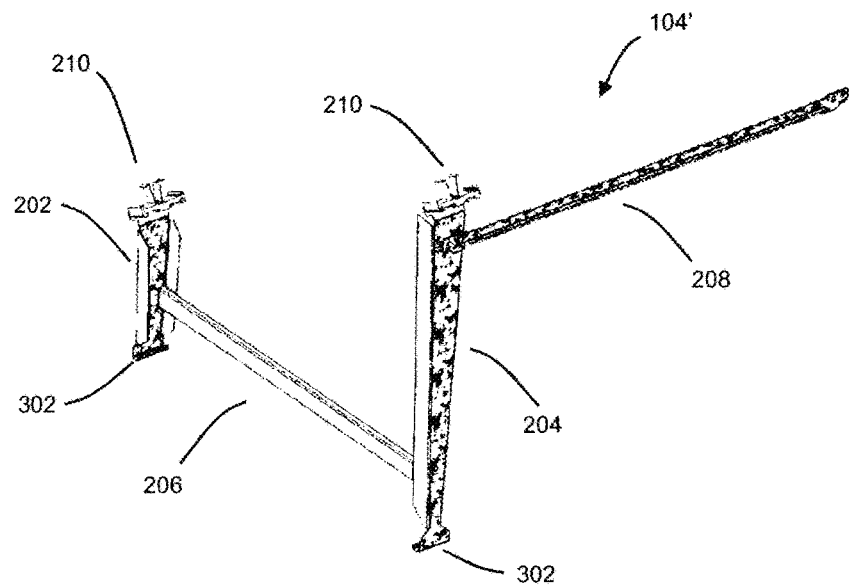
FIG. 3 schematically illustrates a close-up perspective view of an exemplary section of a racking system.

FIG. 3 schematically illustrates a close-up perspective view of an exemplary section 104' of the racking system 104 illustrated in FIGS. 1 and 2. Section 104' can include one of the front legs 202, one of the rear legs 204, one of the cross braces 206 connecting that front leg 202 and that rear leg 204, one of the struts 208 coupled to that rear leg 204, and landings 210 at the tops of those front and rear legs. Section 104' also can include feet 302 at the bottom of the respective front legs 202 and rear legs 204. In this nonlimiting example, each foot 302 can include a curved piece over which adhesive is deposited so as to form a mechanical lock between walls of the concrete groove and that foot. A plurality of sections 104' can be assembled to one another so as to provide a racking system 104 such as illustrated in FIGS. 1 and 2. For example, a first section 104' can be placed on a concrete track 106, e.g., with feet 302 of the first and second legs 202, 204 each within a respective groove of the concrete track 106. The strut 208 of that first section 104' will extend into free space, with the first and second legs 202, 204 of that section joined together with cross brace 206. A second section 104' can be placed on the concrete track in similar manner at a location adjacent to the first section 104', and can be coupled to the first section 104' via the strut 208 of the first section. Mechanical fasteners, such as bolts, screws, or rivets, can be used to couple the strut 208 of one section to the rear leg of the adjacent section. The strut 208 of the second section 104' will extend into free space, and can be coupled to the rear leg of a third section 104' in similar manner.

Figure 4:
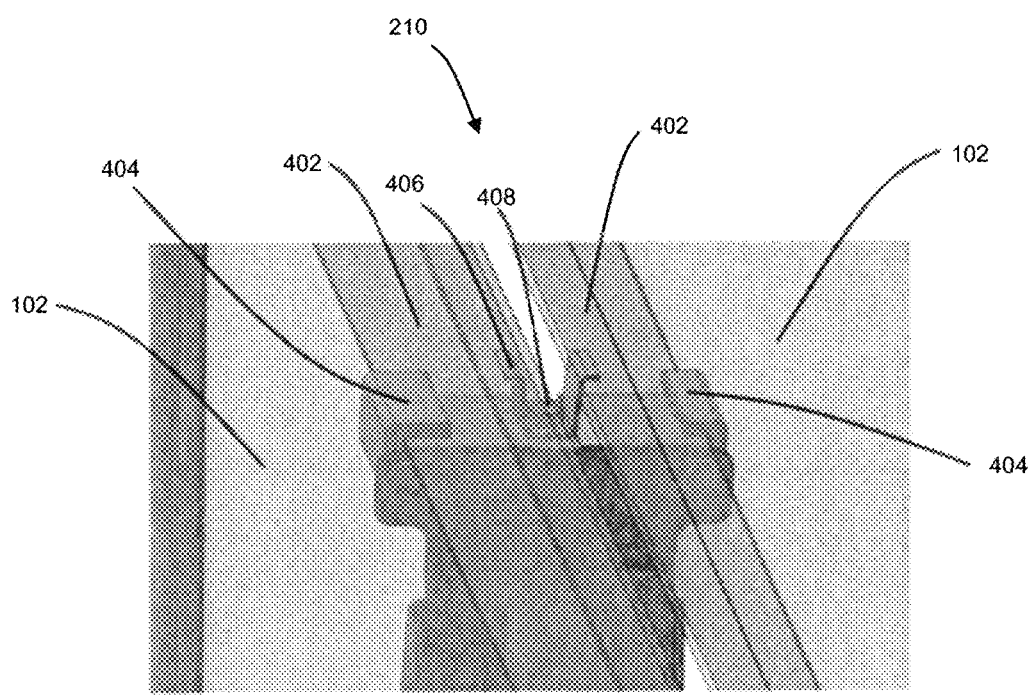
FIG. 4 schematically illustrates a detailed view of an exemplary landing to which two framed solar modules can be attached so as to attach the modules to a racking system.

FIG. 4 schematically illustrates a detailed view of an exemplary landing 210 to which two framed solar modules 102 can be attached so as to attach the modules 102 to the racking system 104. In this nonlimiting example, the solar modules 102 each include module frames 402. The module frame can optionally can include a where an assembly including glass, photovoltaic cells, and encapsulant can be attached to the top of the C-shaped section and where a flat strip of metal parallel to the upper assembly forms the bottom of the C-shaped frame cross section and continues around the edge of the frame. Additionally, in this nonlimiting example, the landing 210 can include two hook flanges 404, a retainer 406, and a fastener 408, e.g., a bolt or machine screw. The module frame 402 of a first one of the solar panels 102 slides and fits under a first one of the hook flanges 404, which pulls that panel in place against the top of the landing. The module frame 402 of a second one of the solar panels 102 slides and fits under a second one of the hook flanges 404, which pulls that panel in place against the top of the landing. In one exemplary configuration, after the two module frames 402 are positioned under respective ones of the hook flanges 404, the retainer 406 can be fastened in place with the fastener 408 so as to secure the two panels 102 to the landing 210. For example, the retainer 406 can include first and second overhangs that respectively contact the upper surfaces of the first and second ones of the solar modules 102 so as to press those modules against the top of the landing. As such, landings 201 such as illustrated in FIG. 4 can secure two solar modules to a front leg 202 or to a rear leg 204 using a relatively simple structure that can be relatively easily assembled in the field.

Figure 5:
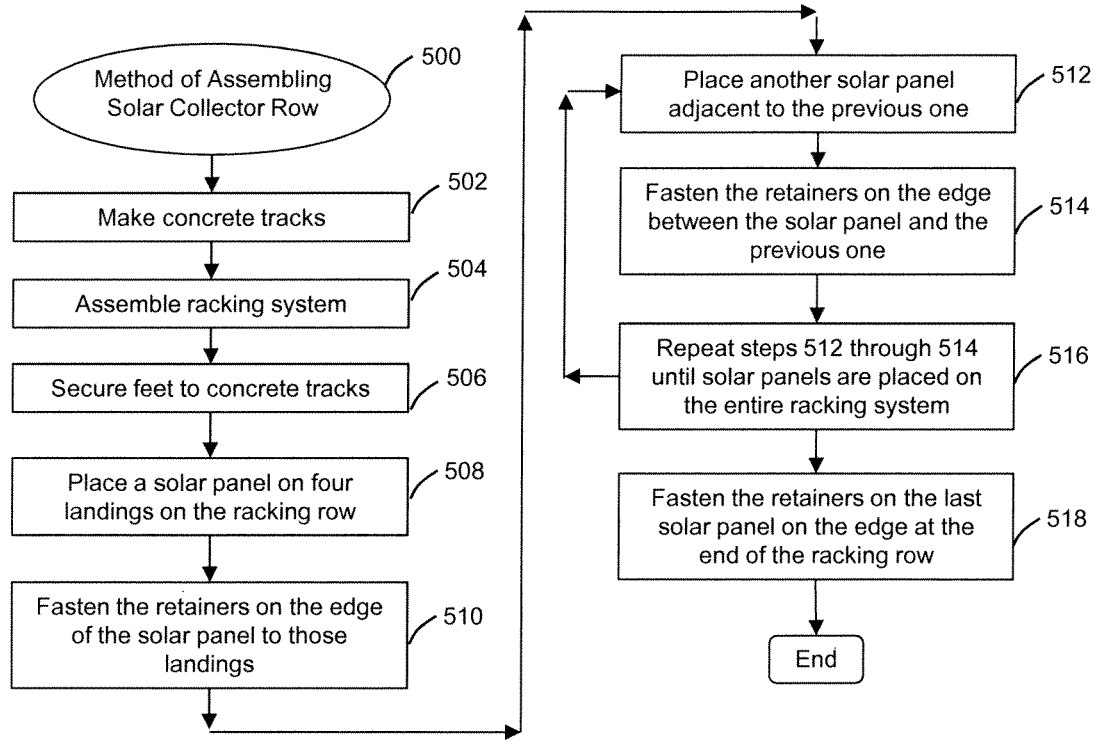
FIG. 5 illustrates a flow of exemplary operations in a method for assembling a solar collector row.

FIG. 5 illustrates a flow of exemplary operations in a method for assembling a solar collector row, e.g., a solar collector row 100 including the concrete track ballast 106, the racking 104, and the solar panels 102 described herein with reference to FIGS. 1-4. In the nonlimiting method 500 illustrated in FIG. 5, concrete tracks are made (operation 502), e.g., concrete tracks 106 can be made by slip-forming concrete. In method 500, the racking system is assembled (operation 504), e.g., the racking system 104 is assembled on the concrete track 106, for example in a manner such as described herein with reference to FIGS. 1-3. Illustratively, sections of the racking system can be placed on the track and coupled to one another, e.g., using struts. In method 500, the feet of the racking system are secured to the concrete tracks (operation 506). For example, the feet 302 of the racking system 104 can be adhered to grooves 212 of the concrete track 106 with a construction epoxy or another appropriate adhesive. As another example, the feet 302 of the racking system can be inserted into the concrete track 106 while the concrete is wet.

After fully or partially assembling the racking system at operations 502-506, the solar panels 102 are installed on the racking system. For example, in method 500, a solar panel can be placed on four landings on the racking row (operation 508), e.g., on the respective landings 210 of first and second front legs 202 that are adjacent to one another, and on the respective landings 210 of first and second rear legs 204 that are adjacent to one another. In method 500, the retainers on at least one edge of the solar panel can be fastened to those landings, e.g., so as to press the solar panel against any suitable number of the landings, e.g., against two of the four landings (operation 510); in configurations where the solar panel placed in operation 508 is the first solar panel in the row, the fasteners are fastened on the edge of the row. In method 500, another solar panel is placed adjacent to the previous one (operation 512), e.g., is placed on four landings on the racking row, where two of the four landings are coupled to the solar panel placed during operation 508. In method 500, the retainers are fastened on the edge between the solar panel and the previous one (operation 514). Operations 512 through 514 can be repeated until solar panels are placed on the entire racking system (operation 516). The retainers can be fastened on the last solar panel on the edge at the end of the racking row (operation 518).

Figure 6:
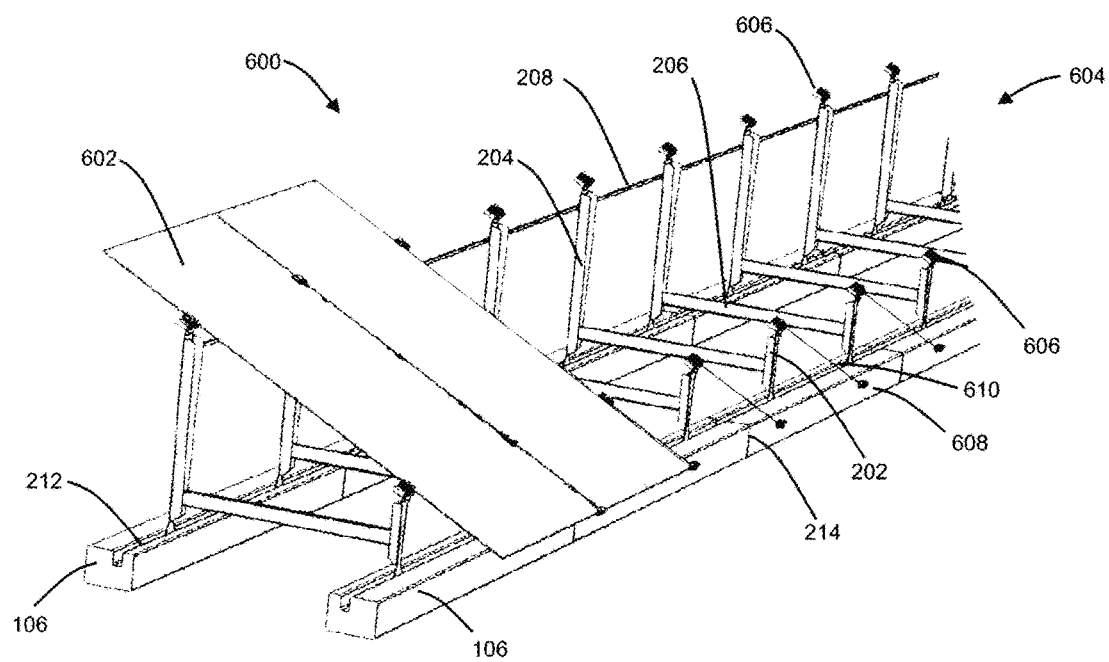
FIGS. 6-8 schematically illustrate elements of an exemplary configuration of a partially assembled solar collector assembly that supports frameless solar panels by a racking system.
Figure 7:
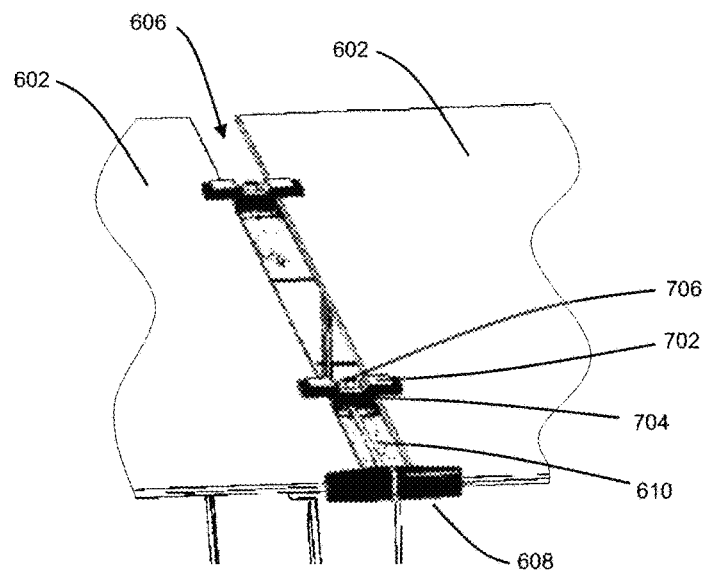
Figure 8:
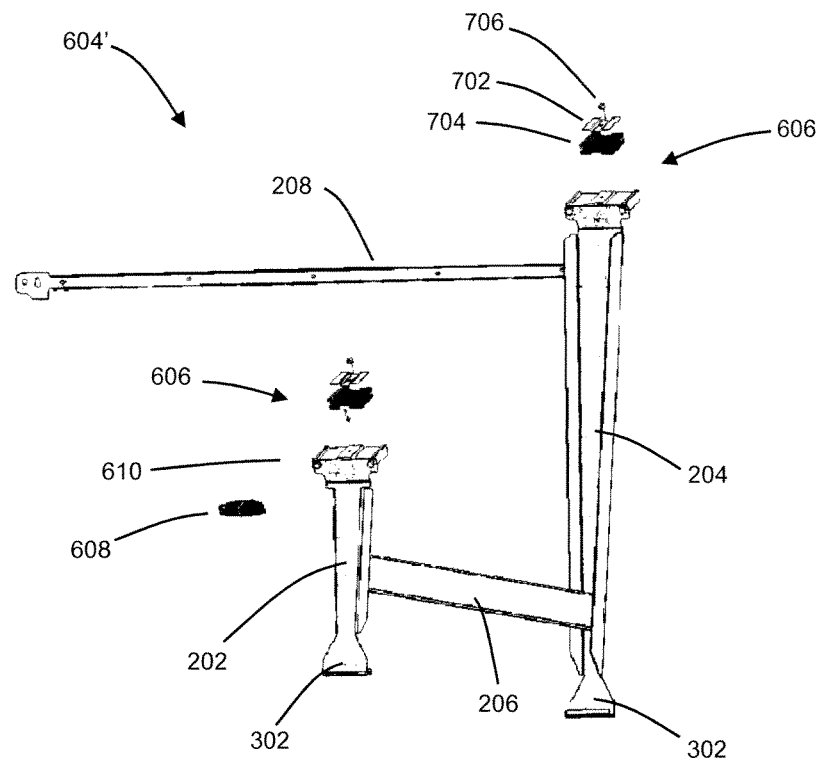

In some configurations of the present systems and methods, the solar modules do not include frames, and such modules can be referred to as "frameless" solar modules or solar panels. Such panels can include two pieces of glass with photovoltaic cells sandwiched therebetween, and an encapsulant surrounding and protecting the photovoltaic cells. In the present systems and methods, frameless modules can be supported using a different attachment system than framed modules. For example, FIGS. 6-8 schematically illustrate elements of an exemplary configuration of a partially assembled solar collector assembly 600 that supports frameless solar panels 602 by a racking system 604. The concrete tracks 106 illustrated in FIG. 6 can be configured similarly as in the exemplary configuration of FIGS. 1-5, and the elements of racking system 604 can be configured similarly as in the exemplary configuration of FIGS. 1-5, except that racking system can include modified landings 606 and edge hooks 608. Similarly as described above with reference to landings 310 of FIGS. 2-3, landings 606 are located at the tops of the racking 604 and configured so as to secure the solar panels 602 to the racking system 604. This exemplary configuration also includes edge hooks 608 that are connected by edge hook rods 610 to the landing 606 located at the top of the front leg 202. The edge hooks help support the bottom edges of the solar panels 602. For example, FIG. 7 schematically illustrates a closer view of the attachment points of the solar panels 602 to the landings 606 in one exemplary configuration. In this example, the landings 606 can include a clamp 702 that presses down against a soft gasket 704. The clamp 702 can be secured with a fastener 706, such as a bolt. The edge hook 608 can include a structure that is configured so as to contact the edges of the solar panel 602, and the edge hook rod 610 can be configured so as to connect the edge hook to the landing 606. FIG. 8 schematically illustrates an exploded view of a section 604' of the racking system 604 shown in FIG. 6, which can be seen to be configured similarly as section 104' illustrated in FIG. 2 and includes a modified landing 606 in addition to front leg 202, cross-brace 206, rear leg 204, strut 208, and feet 302.

Figure 9:
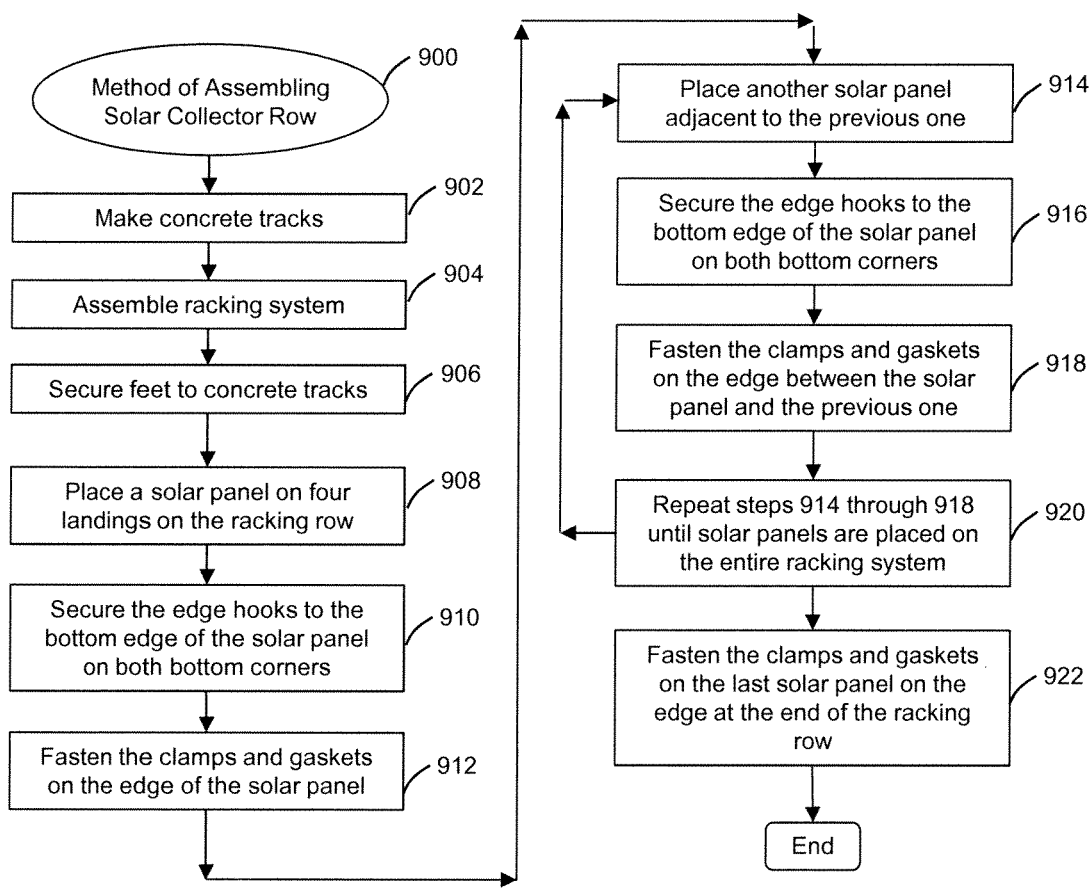
FIG. 9 schematically illustrates an exemplary configuration of a method for assembling a solar collector row for a racking system.

FIG. 9 schematically illustrates an exemplary configuration of a method for assembling a solar collector row for a racking system such as described herein with reference to FIGS. 5-8. FIG. 9 illustrates a flow of exemplary operations in a method for assembling a solar collector row, e.g., a solar collector row 100 including the concrete track ballast 106, the racking system 604, and the solar panels 102 described herein with reference to FIGS. 5-8. In the nonlimiting method 900 illustrated in FIG. 9, concrete tracks are made (operation 902), e.g., concrete tracks 106 can be made by slip-forming concrete. In method 900, the racking system is assembled (operation 904), e.g., the racking system 604 is assembled on the concrete track 106, for example in a manner similar to that described herein with reference to FIGS. 1-3. Illustratively, sections of the racking system can be placed on the track and coupled to one another, e.g., using struts and mechanical fasteners. In method 900, the feet of the racking system are secured to the concrete tracks (operation 906). For example, the feet 302 of the racking system 604 can be adhered to grooves 212 of the concrete track 106 with a construction epoxy or another appropriate adhesive. As another example, the feet 302 of the racking system 604 can be inserted into the concrete track 106 while the concrete is wet.

After fully or partially assembling the racking system at operations 902-906, the solar panels 102 are installed on the racking system. For example, in method 900, a solar panel can be placed on four landings on the racking row (operation 908), e.g., on the respective landings 210 of first and second front legs 202 that are adjacent to one another, and on the respective landings 210 of first and second rear legs 204 that are adjacent to one another. In method 900, the edge hooks are secured to the bottom edge of the solar panel on both bottom corners, e.g., so as to secure the solar panel against any suitable number of the landings, e.g., against two of the four landings, such as the two landings 606 associated with the front legs 202 (operation 910). In method 900, the clamps and gaskets on the edge of the solar panel are fastened (operation 912); for example, in configurations where the solar panel placed in operation 908 is the first solar panel in the row, operation 908 fasteners are fastened on the edge of the row. In method 900, another solar panel is placed adjacent to the previous one (operation 914), e.g., is placed on four landings on the racking row, where two of the four landings are coupled to the solar panel placed during operation 908. In method 900, edge hooks are secured to the bottom edge of the solar panel on both bottom corners (operation 916), e.g., similarly as in step 910. In method 900, the clamps and gaskets on the edge of the solar panel are fastened on the edge between the solar panel and the previous one (operation 918). Operations 914 through 918 can be repeated until solar panels are placed on the entire racking system (operation 920). The clamps and gaskets can be fastened on the last solar panel on the edge at the end of the racking row (operation 922).

Figure 10:
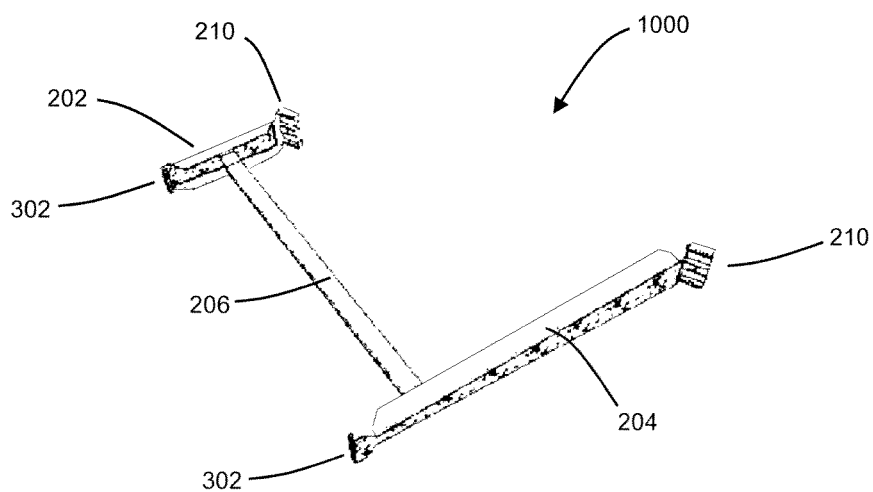
FIG. 10 schematically illustrates a leg assembly for an alternative exemplary configuration of the solar collector system.
Figure 11:
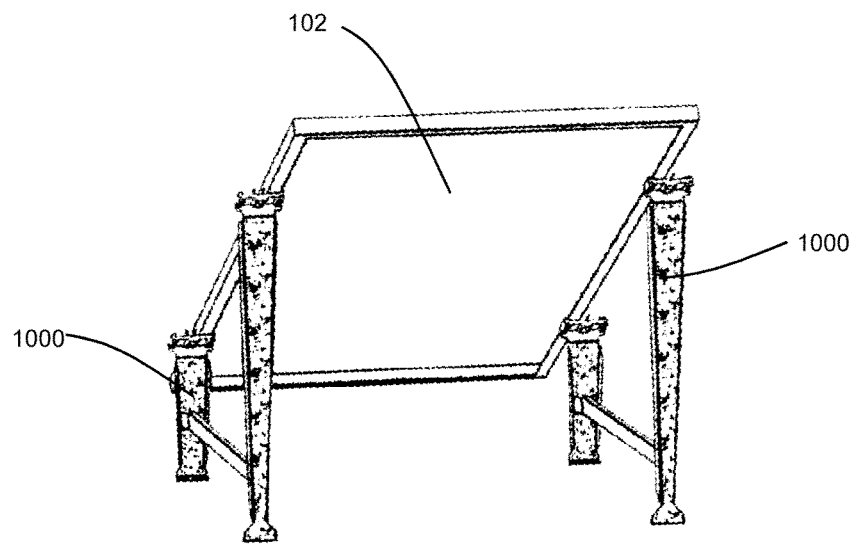
FIG. 11 schematically illustrates an exemplary solar panel with two leg sets of FIG. 10 attached to it, one on either side of the solar panel.
Figure 12:
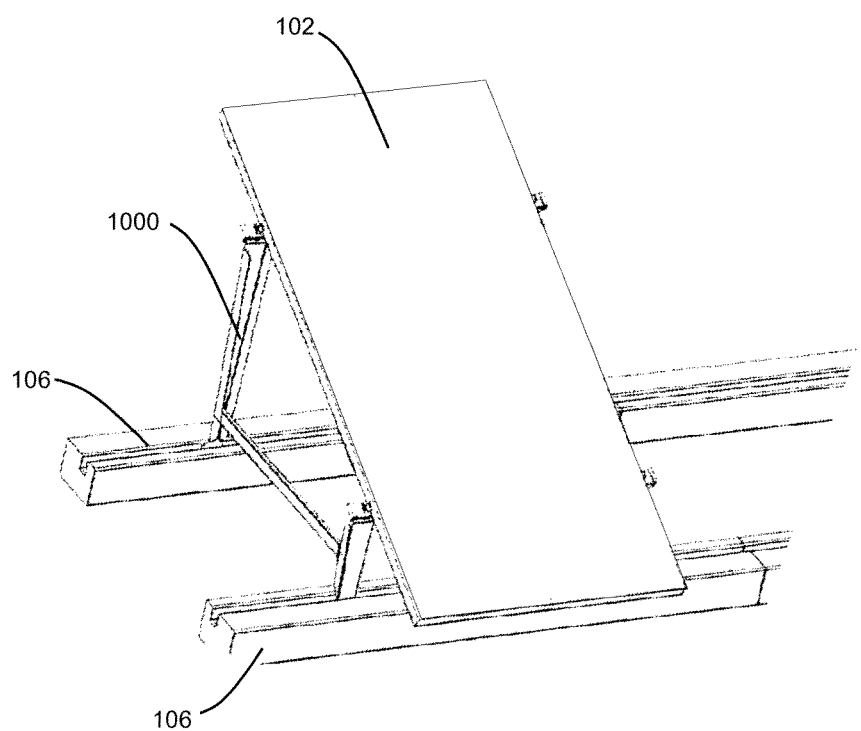
FIG. 12 schematically illustrates the assembly from FIG. 11 placed on two concrete tracks as can be done during assembly.
Figure 13:
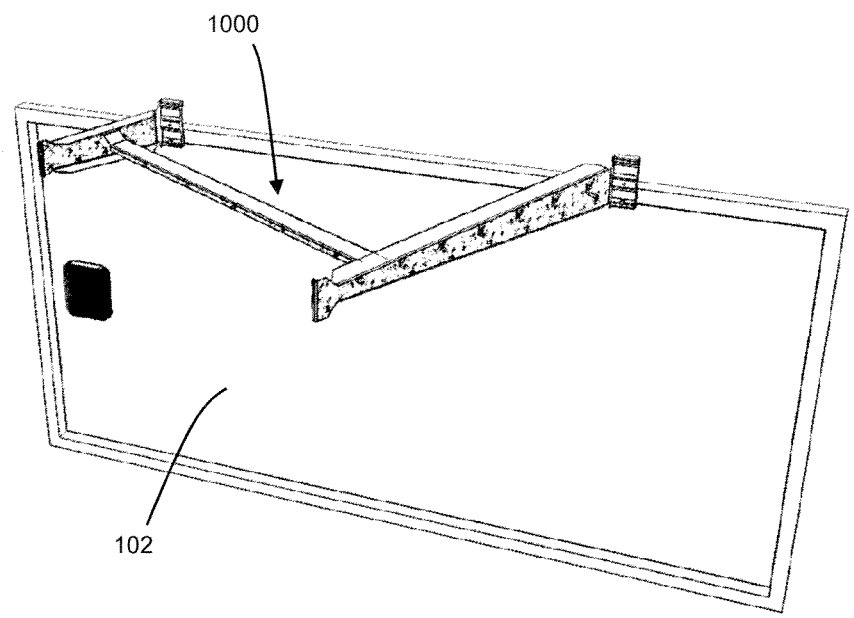
FIG. 13 schematically illustrates a partial assembly in which one leg set is attached for another solar panel FIG. 14 schematically illustrates a next step of assembly in which after a first solar panel with two legs attached to it is placed on the concrete tracks, a second panel with one leg set attached to it is placed next to the first one.
Figure 14:
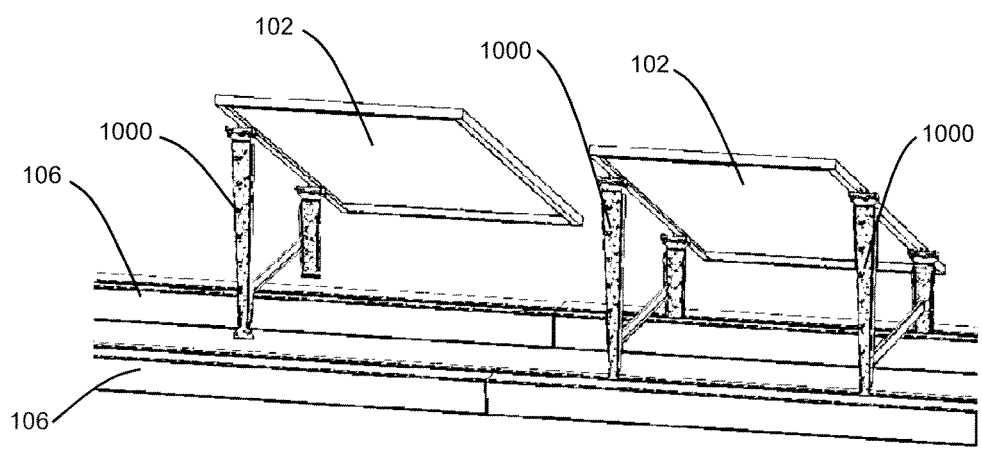
Figure 16A:
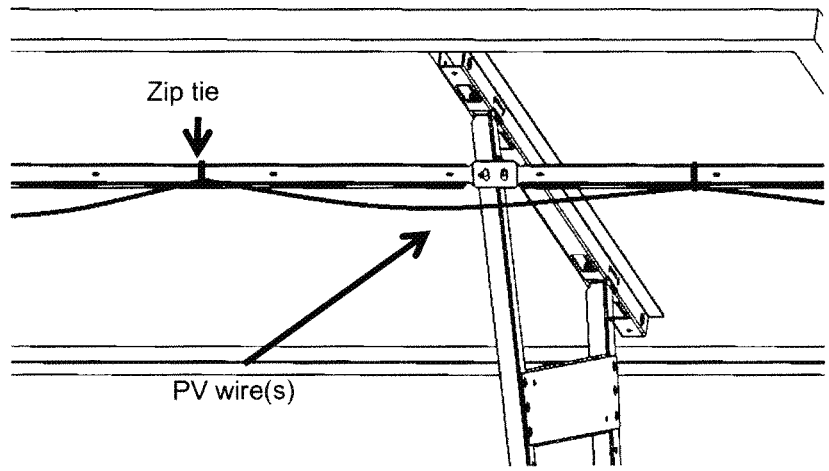
FIGS. 16A-16C illustrate additional alternative configurations.
Figure 16B:
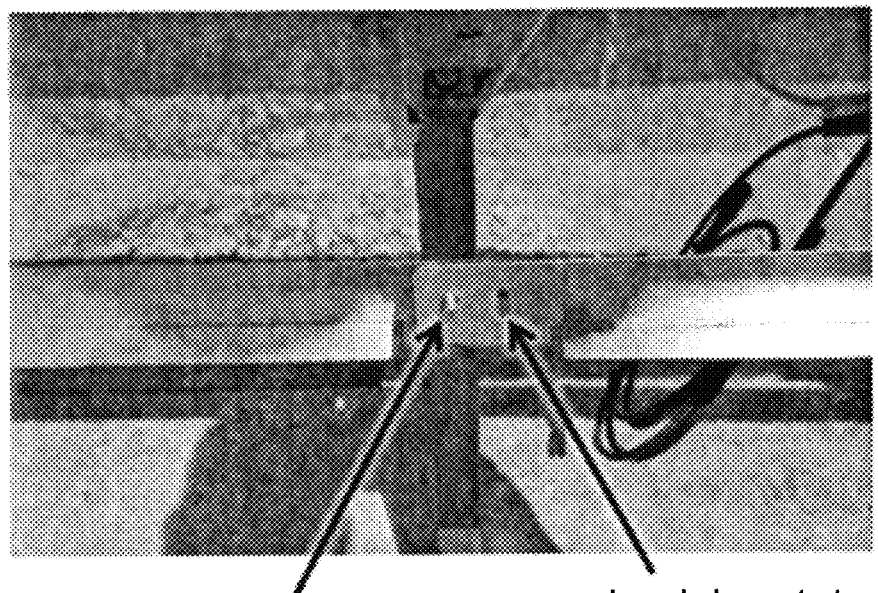
Figure 16C:
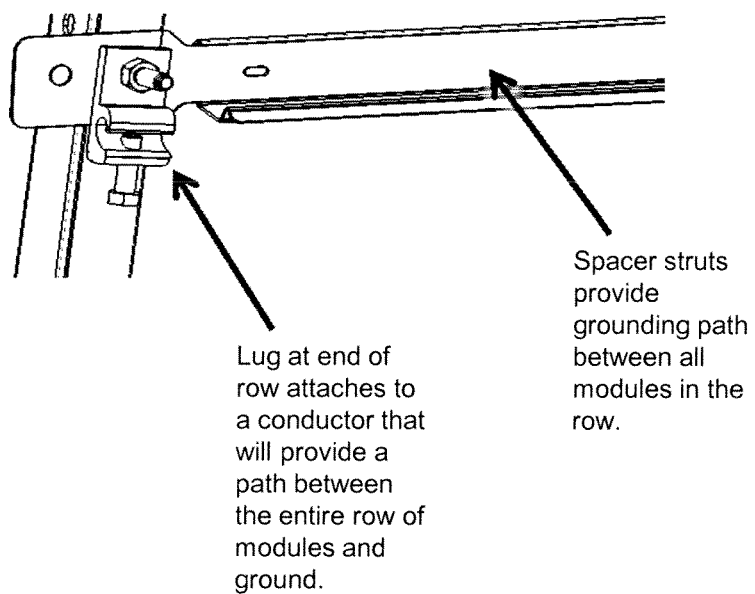

FIG. 10 schematically illustrates a leg assembly 1000 for an alternative exemplary configuration of the solar collector system. The exemplary leg assembly illustrated in FIG. 10 includes a front leg 202, a rear leg 204, a cross brace connecting them 206, landings 210 at the tops of each leg, and feet 302 at the bottom of each leg, which components can be configured similarly as the corresponding components of section 104' described herein with reference to FIG. 3. In this exemplary configuration, the leg set is attached to solar panels before they are installed on the concrete track. For example, FIG. 11 schematically illustrates a solar panel 102 with two leg sets 1000 attached to it, one on either side of the solar panel. FIG. 12 schematically illustrates the assembly from FIG. 11 placed on two concrete tracks 106 as can be done during assembly. Optionally, a strut, such as strut 208 in FIG. 3, can be fastened between the two leg assemblies 1000 for greater stability, stiffness, and strength. FIG. 13 schematically illustrates a partial assembly in which one leg set 1000 is attached for a solar panel 102. FIG. 14 schematically illustrates the next step of assembly where after a first solar panel with two legs attached to it is placed on the concrete tracks, a second panel with one leg set 1000 attached to it is placed next to the first one. The leg set 1000 between the first and second panels is shared by those panels. Optionally, a strut, such as strut 208 in FIG. 3, can be fastened between the leg assembly 1000 of this additional partial assembly with the leg set shared by it and the adjacent solar panel. Exemplary configurations of a strut 208 are illustrated in FIGS. 16A-16C. For example, in FIG. 16A, spacer struts serve as a structure that can be used for wire management; optionally, zip ties are used to secure PV wire(s) to the struts. In the example shown in FIG. 16B, an outer hole on the strut is used for attachments in intermodule location. An inner hole on the strut is used for attaching the strut to both legs of a module. Tear-drop shape secures the strut even without a nut in place. In the example shown in FIG. 16C, a lug at the end of a row attaches to a conductor that can provide a path between the entire row of modules and the ground. Spacer struts can provide a grounding path between all modules in the row. In some examples, leg assemblies can be glued to the module (solar panel) back sheet, or can be mechanically attached to the module and/or to the module frame. Assembly continues where panels with a single leg set attached can be added on one at a time down the concrete track.

Figure 15:
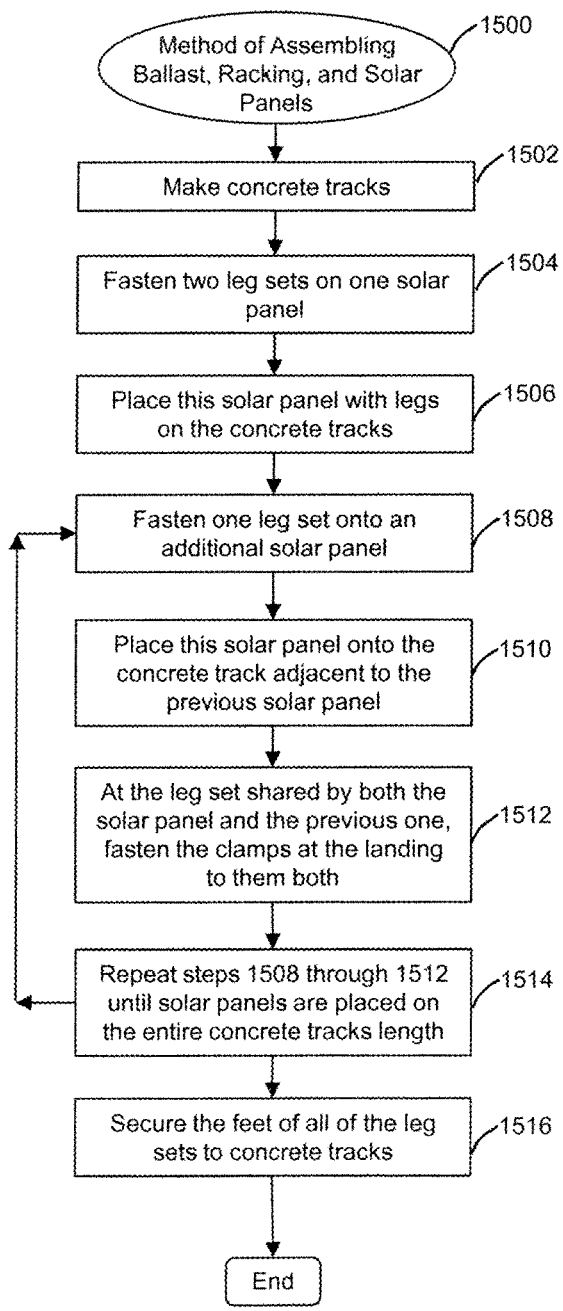
FIG. 15 illustrates a flow of exemplary operations in an alternative method for assembling a solar collector row.

FIG. 15 illustrates a flow of exemplary operations in a method for assembling a solar collector row, e.g., a solar collector row 100 including the concrete track ballast 106, the leg set 1000, and the solar panels 102 described herein with reference to FIGS. 10-14. In the nonlimiting method 1500 illustrated in FIG. 15, concrete tracks are made (operation 1502), e.g., concrete tracks 106 can be made by slip-forming concrete. In method 1500, two leg sets are fastened onto a first solar panel (operation 1504), e.g., first and second leg sets 1000 are fastened to a solar panel 102 in a manner such as illustrated in FIG. 11. In method 1500, this solar panel with legs is placed on the concrete tracks (operation 1506), e.g., feet 302 can be inserted into respective grooves of the concrete tracks, e.g., in a manner such as illustrated in FIG. 12. Optionally, a strut, such as strut 208 in FIG. 3, can be fastened to the two leg sets 1000. In method 1500, one leg set is fastened onto an additional solar panel (operation 1508), e.g., in a manner such as illustrated in FIG. 13. In method 1500, this solar panel is placed onto the concrete track adjacent to the previous solar panel (operation 1510), e.g., in a manner such as illustrated in FIG. 14. Optionally, a strut, such as strut 208 in FIG. 3, can be fastened to the leg set 1000 of this additional solar panel and to adjacent existing leg set 1000. During operation 1510, this solar panel can be supported by one of the leg sets of the previous solar panel, which were added at operation 1504, as well as by the leg set added at operation 1508. Operations 1508 through 1512 can be repeated until solar panels are placed on the entire racking system (operation 1514). In method 1500, the feet of the racking system, e.g., the feet of all the leg sets, are secured to the concrete tracks (operation 1506). For example, the feet 302 of each of the leg sets 1000 can be adhered to grooves 212 of the concrete track 106 with a construction epoxy or another appropriate adhesive. As another example, the feet 302 of each of the leg sets 1000 can be inserted into the concrete track 106 while the concrete is wet. Note that for method 1500, the panels can be framed or frameless and the landing and edge hook, if used, can be configured accordingly.

In one exemplary configuration, a method of supporting solar panels is provided that includes forming at least one concrete track; and assembling first, second, and third racking structures each including two legs, landings at tops of respective ones of the legs, and feet at bottoms of respective ones of the legs. The feet of the assembled first racking structure can be secured to the at least one concrete track; the feet of the assembled second racking structure can be secured to the at least one concrete track; and the feet of the assembled third racking structure can be secured to the at least one concrete track. A first solar panel can be placed on the landings of the first and second racking structures. A first edge of the first solar panel can be secured to each the landings of the first racking structure. A second solar panel can be placed on the landings of the second racking structure and on the landings of the third racking structure. A second edge of the first solar panel and a first edge of the second solar panel can be secured to each the landings of the second racking structure. Non-limiting examples of such a method are provided herein, e.g., with reference to FIGS. 1, 2, 3, 4, 5, 6, 7, 8, 9, 10, 11, 12, 13, 14, and 15.

Optionally, forming the at least one concrete track includes slip forming first and second discrete concrete tracks, e.g., such as provided herein with reference to FIGS. 1, 5, 9, and 15.

Additionally, or alternatively, each of the first, second, and third racking structures optionally further includes a cross brace coupling the legs of that racking structure to one another, the cross brace extending in a direction substantially transverse to the at least one concrete track. Examples of such racking structures are provided herein with reference to FIGS. 3, 8, and 10.

Additionally, or alternatively, each of the first, second, and third racking structures optionally further includes a strut extending in a direction substantially parallel to the at least one concrete track, the strut of the first racking structure coupling one of the legs of the first racking structure to one of the legs of the second racking structure, the strut of the second racking structure coupling one of the legs of the second racking structure to one of the legs of the third racking structure. Examples of such racking structures are provided herein with reference to FIGS. 3 and 8.

Additionally, or alternatively, securing the feet to the concrete track optionally includes inserting the feet into grooves of the concrete track and applying adhesive within the grooves, e.g., such as provided herein with reference to FIGS. 1, 5, 9, and 15.

Additionally, or alternatively, securing the feet to the concrete track optionally includes setting the feet into the concrete track while the concrete is wet, e.g., such as provided herein with reference to FIGS. 1, 5, 9, and 15.

Additionally, or alternatively, securing the second edge of the first solar panel and the first edge of the second solar panel to each the landings of the second racking structure optionally includes fastening a structure to that landing, wherein the structure presses the solar panel onto that landing. Examples of such structures are provided herein, such as retainer 406 described with reference to FIG. 4, and clamp 702 described with reference to FIG. 7.

As a further option, the first and second solar panels optionally each can include a frame, and each of the landings can include a hook flange under which the frame of one of the first and second solar panels fits to pull the solar panel onto that landing. Examples of such a hook flange are provided herein, such as hook flange 404 described with reference to FIG. 4.

As an additional or other option, the structure optionally includes a retainer including first and second overhangs that respectively contact the upper surfaces of the first and second solar panels. Examples of such retainer are provided herein, such as retainer 406 described with reference to FIG. 4.

As another option, the first and second solar panels each can be frameless, each landing can include a gasket, and the structure can include a clamp that contacts the upper surfaces of the first and second solar panels. Examples of such gasket and clamp are provided herein, such as gasket 704 and clamp 702 described with reference to FIG. 7.

Additionally, or alternatively, the first solar panel optionally can be secured to the landings of the first and second racking structures after the first and second racking structures are secured to the at least one concrete track, e.g., such as described with reference to FIG. 5.

Additionally, or alternatively, the first solar panel optionally can be secured to the landings of the first and second racking structures before the first and second racking structures are placed on and secured to the at least one concrete track, e.g., such as described with reference to FIG. 9.

As a further option, the third racking structure can be placed on and secured to the at least one concrete track after the first solar panel is secured to the landings of the first and second racking structures, e.g., such as described with reference to FIG. 9.

Under another aspect, a system is provided for supporting a solar panel. The system can include at least one concrete track; and first, second, and third racking structures each including two legs, landings at tops of respective ones of the legs, and feet at bottoms of respective ones of the legs. The feet of the first, second, and third racking structures can be secured to the at least one concrete track. A first solar panel can be disposed on the landings of the first and second racking structures. A first edge of the first solar panel can be secured to each the landings of the first racking structure. A second edge of the first solar panel and a first edge of a second solar panel are secured to each the landings of the second racking structure. Non-limiting examples of such a system are provided herein, e.g., with reference to FIGS. 1, 2, 3, 4, 6, 7, 8, 10, 11, 12, 13, and 14.

Optionally, the at least one concrete track includes slip-formed first and second discrete concrete tracks, e.g., such as described with reference to FIG. 1.

Additionally, or alternatively, each of the first, second, and third racking structures optionally further can include a cross brace coupling the legs of that racking structure to one another, the cross brace extending in a direction substantially transverse to the at least one concrete track. Examples of such racking structures are provided herein with reference to FIGS. 3, 8, and 10.

Additionally, or alternatively, each of the first, second, and third racking structures optionally further can include a strut extending in a direction substantially parallel to the at least one concrete track, the strut of the first racking structure coupling one of the legs of the first racking structure to one of the legs of the second racking structure, the strut of the second racking structure coupling one of the legs of the second racking structure to one of the legs of the third racking structure. Examples of such racking structures are provided herein with reference to FIGS. 3 and 8.

Additionally, or alternatively, the feet optionally can be disposed in grooves of the concrete track and locked within the grooves with adhesive. As another option, the feet can be set into the concrete track. Such options are described, for example, with reference to FIG. 1.

Additionally, or alternatively, the second edge of the first solar panel and the first edge of the second solar panel optionally can be secured to each the landings of the second racking structure by a structure fastened to that landing, wherein the structure presses the solar panel onto that landing. Examples of such structures are provided herein, such as retainer 406 described with reference to FIG. 4, and clamp 702 described with reference to FIG. 7.

As a further option, the first and second solar panels each can include a frame and each of the landings can include a hook flange under which the frame of one of the first and second solar panels fits to pull the solar panel onto that landing. Examples of such a hook flange are provided herein, such as hook flange 404 described with reference to FIG. 4.

As a still further option, the structure can include a retainer including first and second overhangs that respectively contact the upper surfaces of the first and second solar panels. Examples of such retainer are provided herein, such as retainer 406 described with reference to FIG. 4.

As another option, the first and second solar panels each can be frameless, each landing can include a gasket, and the structure can include a clamp that contacts the upper surfaces of the first and second solar panels. Examples of such gasket and clamp are provided herein, such as gasket 704 and clamp 702 described with reference to FIG. 7.

While various illustrative embodiments of the invention are described herein, it will be apparent to one skilled in the art that various changes and modifications may be made therein without departing from the invention. For example, the present systems and methods are not limited to use with photovoltaic modules, and instead can be applied to solar collectors including any type of solar module (e.g., a module such as used with a non-concentrating solar thermal collector or with a concentrated solar power system, such as a parabolic trough or heliostat), or to racking or supporting any other type of structure. All such changes and modifications that fall within the true spirit and scope of the invention are encompassed by the following claims.

What is claimed is:

1. A method of supporting solar panels, the method comprising:
    forming first and second concrete tracks;
    assembling first, second, and third racking structures, each comprising:
        front and rear legs;
        first landings at tops of the front legs;
        second landings at tops of the rear legs, wherein the second landings are not directly coupled to the first landings by a structural member;
        front feet at bottoms of the front legs; and
        rear feet at bottoms of the rear legs;
    securing the front feet of the assembled first, second, and third racking structures to the first concrete track;
    securing the rear feet of the first, second, and third racking structures to the second concrete track;
    placing a first solar panel on the first and second landings of the first and second racking structures;
    securing a first edge of the first solar panel to each of the first and second landings of the first racking structure;
    placing a second solar panel on the first and second landings of the second racking structure and on the first and second landings of the third racking structure; and
    securing a second edge of the first solar panel and a first edge of the second solar panel to the first and second landings of the second racking structure
    wherein the first concrete track and the second concrete track are positioned in a direction that is transverse to the first edge of the first solar panel, the first edge of the second solar panel, and the second edge of the first solar panel.

2. The method of claim 1, wherein forming the at least one concrete track comprises slip forming first and second discrete concrete tracks.

3. The method of claim 1, wherein each of the first, second, and third racking structures further comprises a cross brace coupling the legs of that racking structure to one another, the cross brace extending in a direction substantially transverse to the at least one concrete track.

4. The method of claim 1, wherein each of the first, second, and third racking structures further comprises a strut extending in a direction substantially parallel to the at least one concrete track, the strut of the first racking structure coupling one of the legs of the first racking structure to one of the legs of the second racking structure, the strut of the second racking structure coupling one of the legs of the second racking structure to one of the legs of the third racking structure.

5. The method of claim 1, wherein securing the feet to the concrete track comprises inserting the feet into grooves of the concrete track and applying adhesive within the grooves.

6. The method of claim 1, wherein securing the feet to the concrete track comprises setting the feet into the concrete track while the concrete is wet.

7. The method of claim 1, wherein securing the second edge of the first solar panel and the first edge of the second solar panel to each of the first and second landings of the second racking structure comprises fastening a structure to each of the first and second landings, wherein the structure presses the solar panel onto a corresponding landing.

8. The method of claim 7, wherein the first and second solar panels each comprise a frame and wherein each of the first and second landings comprises a hook flange under which the frame of one of the first and second solar panels fits to pull the solar panel onto the corresponding landing.

9. The method of claim 7, wherein the structure comprises a retainer comprising first and second overhangs that respectively contact the upper surfaces of the first and second solar panels.

10. The method of claim 7, wherein the first and second solar panels each are frameless, wherein each of the first and second landings comprises a gasket, and wherein the structure comprises a clamp that contacts the upper surfaces of the first and second solar panels.

11. The method of claim 1, wherein the first solar panel is secured to the first and second landings of the first and second racking structures after the first and second racking structures are secured to the at least one concrete track.

12. The method of claim 1, wherein the first solar panel is secured to the first and second landings of the first and second racking structures before the first and second racking structures are placed on and secured to the at least one concrete track.

13. The method of claim 12, wherein the third racking structure is placed on and secured to the at least one concrete track after the first solar panel is secured to the first and second landings of the first and second racking structures.

14. A system for supporting a solar panel, the system comprising:
first and second concrete tracks;
first, second, and third racking structures each comprising:
front and rear legs;
first landings at tops of the front legs;
second landings at tops of the rear legs, wherein the second landings are not directly coupled to the first landings by a structural member;
front feet at bottoms of the front legs; and
rear feet at bottoms of the rear legs;
rear feet at bottoms of the rear legs;
the front feet of the first, second, and third racking structures being secured to the first concrete track;
the rear feet of the first, second, and third racking structures being secured to the second concrete track;
wherein a first solar panel is disposed on the first and second landings of the first and second racking structures,
wherein a first edge of the first solar panel secured to the first and second landings of the first racking structure; and wherein a second edge of the first solar panel and a first edge of a second solar panel are secured to the first and second landings of the second racking structure
wherein the first concrete track and the second concrete track are positioned in a direction that is transverse to the first edge of the first solar panel, the first edge of the second solar panel, and the second edge of the first solar panel.

15. The system of claim 14, wherein forming the at least one concrete track comprises slipformed first and second discrete concrete tracks.

16. The system of claim 14, wherein each of the first, second, and third racking structures further comprises a cross brace coupling the legs of that racking structure to one another, the cross brace extending in a direction substantially transverse to the at least one concrete track.

17. The system of claim 14, wherein each of the first, second, and third racking structures further comprises a strut extending in a direction substantially parallel to the at least one concrete track, the strut of the first racking structure coupling one of the legs of the first racking structure to one of the legs of the second racking structure, the strut of the second racking structure coupling one of the legs of the second racking structure to one of the legs of the third racking structure.

18. The system of claim 14, wherein the feet are disposed in grooves of the concrete track and locked within the grooves with adhesive.

19. The system of claim 14, wherein the feet are set into the concrete track.

20. The system of claim 14, wherein the second edge of the first solar panel and the first edge of the second solar panel are secured to each of the first and second landings of the second racking structure by a structure fastened to each of the first and second landings, wherein the structure presses the solar panel onto a corresponding landing.

21. The system of claim 20, wherein the first and second solar panels each comprise a frame and wherein each of the first and second landings comprises a hook flange under which the frame of one of the first and second solar panels fits to pull the solar panel onto the corresponding landing.

22. The system of claim 20, wherein the structure comprises a retainer comprising first and second overhangs that respectively contact the upper surfaces of the first and second solar panels.

23. The system of claim 20, wherein the first and second solar panels each are frameless, wherein each of the first and second landings comprises a gasket, and wherein the structure comprises a clamp that contacts the upper surfaces of the first and second solar panels.

* * * * *